(12) United States Patent
Ando et al.

(10) Patent No.: US 9,472,419 B2
(45) Date of Patent: Oct. 18, 2016

(54) METHOD OF PATTERNING DOPANT FILMS IN HIGH-K DIELECTRICS IN A SOFT MASK INTEGRATION SCHEME

(71) Applicant: International Business Machines Corporation, Armonk, NY (US)

(72) Inventors: Takashi Ando, Tuckahoe, NY (US); Hemanth Jagannathan, Niskayuna, NY (US); Balaji Kannan, Fishkill, NY (US); Siddarth A. Krishnan, Newark, CA (US); Unoh Kwon, Fishkill, NY (US); Rekha Rajaram, Scarsdale, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 14/919,796

(22) Filed: Oct. 22, 2015

(65) Prior Publication Data

US 2016/0049337 A1  Feb. 18, 2016

Related U.S. Application Data

(62) Division of application No. 14/340,068, filed on Jul. 24, 2014, now Pat. No. 9,330,938.

(51) Int. Cl.
*H01L 21/76* (2006.01)
*H01L 21/3213* (2006.01)
(Continued)

(52) U.S. Cl.
CPC ..... *H01L 21/32133* (2013.01); *H01L 21/0332* (2013.01); *H01L 21/225* (2013.01); *H01L 21/28079* (2013.01); *H01L 21/28088* (2013.01); *H01L 21/28185* (2013.01); *H01L 21/28194* (2013.01); *H01L 21/28229* (2013.01);
(Continued)

(58) Field of Classification Search
CPC ............. H01L 21/32133; H01L 21/823857; H01L 21/28088; H01L 21/28079; H01L 21/32115; H01L 21/32139; H01L 21/32135; H01L 21/0332; H01L 21/823437; H01L 21/324; H01L 21/3115; H01L 21/31116; H01L 21/225; H01L 29/66545; H01L 21/28185; H01L 21/02; H01L 21/82345; H01L 29/513; H01L 29/4966; H01L 21/823462
See application file for complete search history.

(56) References Cited

U.S. PATENT DOCUMENTS 7,838,908 B2   11/2010   Kwon et al.
8,309,419 B2   11/2012   Schaeffer et al.
(Continued)

OTHER PUBLICATIONS

IBM: List of IBM Patents or Patent Applications Treated As Related (Appendix P), Mar. 4, 2016 , 2 pages.
(Continued)

*Primary Examiner* — Stephen W Smoot
*Assistant Examiner* — Vicki B Booker
(74) *Attorney, Agent, or Firm* — L. Jeffrey Kelly; Steven Meyers

(57) ABSTRACT

A method of fabricating advanced node field effect transistors using a replacement metal gate process. The method includes dopant a high-k dielectric directly or indirectly by using layers composed of multi-layer thin film stacks, or in other embodiments, by a single blocking layer. By taking advantage of unexpected etch selectivity of the multi-layer stack or the controlled etch process of a single layer stack, etch damage to the high-k may be avoided and work function metal thicknesses can be tightly controlled which in turn allows field effect transistors with low Tinv (inverse of gate capacitance) mismatch.

10 Claims, 15 Drawing Sheets

(51) Int. Cl.
  *H01L 21/28*    (2006.01)
  *H01L 21/321*   (2006.01)
  *H01L 21/033*   (2006.01)
  *H01L 21/225*   (2006.01)
  *H01L 21/311*   (2006.01)
  *H01L 21/3115*  (2006.01)
  *H01L 21/324*   (2006.01)
  *H01L 21/8234*  (2006.01)
  *H01L 29/66*    (2006.01)
  *H01L 21/8238*  (2006.01)
  *H01L 29/49*    (2006.01)
  *H01L 29/51*    (2006.01)

(52) U.S. Cl.
  CPC ...... *H01L21/3115* (2013.01); *H01L 21/31116* (2013.01); *H01L 21/324* (2013.01); *H01L 21/32115* (2013.01); *H01L 21/32135* (2013.01); *H01L 21/32139* (2013.01); *H01L 21/823437* (2013.01); *H01L 21/823842* (2013.01); *H01L 21/823857* (2013.01); *H01L 29/517* (2013.01); *H01L 29/66545* (2013.01); *H01L 21/82345* (2013.01); *H01L 21/823462* (2013.01); *H01L 29/4966* (2013.01); *H01L 29/513* (2013.01)

(56) References Cited

U.S. PATENT DOCUMENTS

| | | | |
|---|---|---|---|
| 8,378,498 | B2 | 2/2013 | Blackshear |
| 8,420,473 | B2 | 4/2013 | Ando et al. |
| 8,445,344 | B2 | 5/2013 | Carter et al. |
| 8,450,946 | B1 | 5/2013 | Lunn et al. |
| 8,581,351 | B2 | 11/2013 | Ando et al. |
| 2012/0061772 | A1 | 3/2012 | Guo et al. |
| 2012/0088358 | A1 | 4/2012 | Lee et al. |
| 2012/0280288 | A1 | 11/2012 | Ando et al. |
| 2013/0049123 | A1 | 2/2013 | Baars et al. |
| 2013/0082332 | A1 | 4/2013 | Liu et al. |
| 2013/0161764 | A1 | 6/2013 | Wong et al. |
| 2013/0187236 | A1 | 7/2013 | Xie et al. |
| 2013/0256802 | A1 | 10/2013 | Jagannathan et al. |
| 2014/0131808 | A1 | 5/2014 | Ando et al. |

OTHER PUBLICATIONS

Pending U.S. Appl. No. 14/340,068, filed Jul. 24, 2014, entitled: "Method of Patterning Dopant Films in High-K Dielectrics in a Soft Mask Integration Scheme", 38 pages.
Pending U.S. Appl. No. 15/058,309, filed Mar. 2, 2016, entitled: "Method of Patterning Dopant Films in High-K Dielectrics in a Soft Mask Integration Scheme", 38 pages.
IBM: List of IBM Patents or Patent Applications Treated As Related (Appendix P), Oct. 27, 2015, 2 pages.

10 - Provide a substrate having a 1st FET region and a 2nd FET region and a dielectric layer having openings over a portion of both regions 20 - Form a high-k layer in the openings in the openings 25 – Form a blocking stack in the openings.

(a) Multilayer    or    (b) Single layer

30 - Lithographically pattern the substrate, leaving the blocking stack in the second FET region and removing the blocking stack in the first FET region to expose the high-k layer 40 - Thin the blocking stack 42 - Form doping stack over both regions of the substrate 50 - Form annealing stack over both regions of the substrate & anneal to drive the dopant into the first high-k layer 55 - Remove annealing stack 60 - Remove doping & remaining blocking stacks 70 – work function metal(s) in 1st and 2nd FET regions 90 - Fill the openings A, B: 1st FET doped 2nd FET undoped

Fig. 1

10 - Provide a substrate having a 1st FET region and a 2nd FET region and a dielectric layer having openings over a portion of both regions 20 - Form a high-k layer in the openings in the openings 22 - Form a doping layer 25 – Form a multi-layer mask in the openings.

30 - Lithographically pattern the substrate, leaving the blocking stack in the one of the FET region and removing the mask in the other FET region to expose the high-k layer 40 - Thin the multi-layer mask 50 - Form annealing stack over both regions of the substrate & anneal to drive the dopant into the first high-k layer 55 - Remove annealing stack 60 - Remove doping & remaining thin mask stacks 70 – work function metals in 1st and 2nd FET regions 90 - Fill the openings

Fig. 13

METHOD OF PATTERNING DOPANT FILMS IN HIGH-K DIELECTRICS IN A SOFT MASK INTEGRATION SCHEME

BACKGROUND OF THE INVENTION

The subject matter of the present application relates to semiconductor devices of integrated circuits and their fabrication, particularly field effect transistors.

One of the ways proposed to improve performance in complementary metal oxide semiconductor ("CMOS") technology integrated circuits is to provide a high dielectric constant, i.e., "high-k" gate dielectric layer, for n-type and p-type field effect transistors ("NFET" and "PFET" devices), and to form metal gates of the NFET and PFET devices.

However, differences in the workfunctions of NFET and PFET devices typically require different metal layers to be provided in the gates of respective N- or P-type transistors. Heretofore, methods for forming the gates of N- and P-type transistors have been cumbersome. Further improvements in the fabrication of N- and P-type transistors having metal gates can be made.

BRIEF DESCRIPTION OF THE DRAWINGS

FIG. 1 is an illustrative flow chart of methods of embodiments of the present invention.

FIG. 13 is an illustrative flow chart of a method of a direct doping embodiment of the present invention.

SUMMARY OF THE INVENTION

Figure 2:
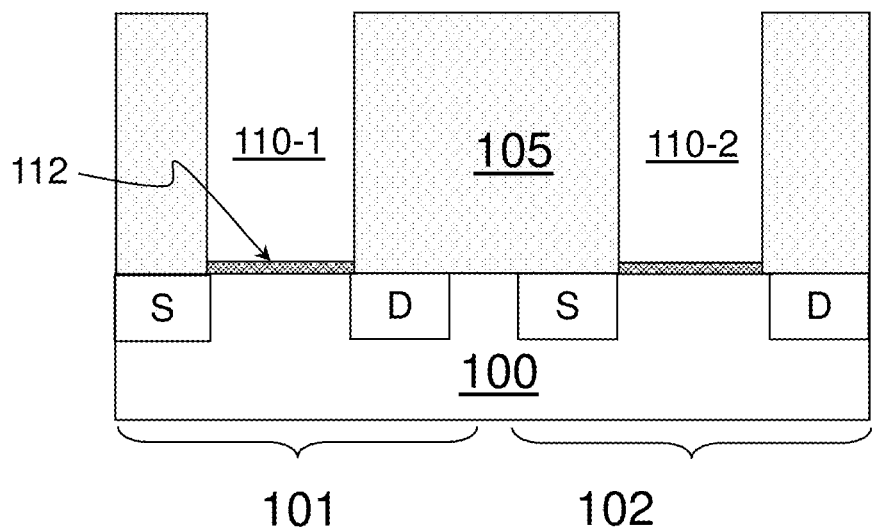
FIG. 2 is a sectional view illustrating a possible starting point of embodiments of the present invention.

The present invention improves performance in complementary metal oxide semiconductor ("CMOS") technology integrated circuits by providing methods for doping the high dielectric constant, i.e., "high-k" gate dielectric layer, of an FET in a replacement metal gate integration scheme.

The present invention advantageously uses selective etching of multi-layered stacks containing a sacrificial film or controlled etching of single layered blocking stack to form high-k replacement metal gate structures made using soft metal mask without degradation of device properties of the transistors. The methods allow threshold differences to be created among different types of FETs or the same type of FET. Presented are doping methods using the stack as a buffer or blocking stack during doping. Another method is a direct doping method of the high-k using a multi-layered stack as a mask.

In one embodiment, herein referred to "embodiment A", a blocking stack allows a replacement metal gate structure having one doped and one undoped high-k gate oxide to be formed in a first and second transistor, respectively. In the context of all the embodiments, the term "doping" refers to the incorporation of metal elements (such as, but not limited to, rare-earth elements like lanthanum) into the high-k gate dielectric film to change the effective work function of the transistor. The method uses a multi-layered blocking layer, which due to its multi-layers, may be initially thick and then later thinned. It is advantageous to have a thick layer when patterning using a soft mask to protect the underlying gate materials from damage during the soft-mask reactive ion etching (RIE) process. The patterning reveals the high-k material in a first FET which is to be doped and leaves the blocking stack on the second FET which is to remain undoped. After the soft mask patterning, the multi-layered blocking stack is thinned and a doping layer is formed everywhere. An anneal migrates dopant into the first high-k layer but the thinned blocking layer keeps the dopant away from the second FET's high-k layer. It is advantageous to have a thinned blocking layer during dopant drive-in to minimize the amount of dissolved oxygen in the TiN blocking layer that diffuses through the underlying gate materials during the high temperature anneal process to prevent adverse impact on Tinv (inverse of gate capacitance). The multi-layered stack may be thinned because the materials are able to be selectively removed with respect to each other and exposed high-k.

In a similar, alternate embodiment herein referred to as "embodiment B", the multi-layered stack is replaced by a single thick titanium nitride layer to allow a replacement metal gate structure having one doped and one undoped high-k gate oxide to be formed in a first and second transistor, respectively. The method uses a single layered blocking film, which may be initially thick and then later thinned. It is advantageous to have a thick layer when patterning using a soft mask. The patterning reveals the high-k material in a first FET which is to be doped and leaves the blocking stack on the second FET which is to remain undoped. After the soft mask patterning, the single layer blocking film is thinned by a controlled wet etch and a doping layer is formed everywhere. An anneal migrates dopant into the first high-k layer but the thinned blocking layer keeps the dopant away from the second FET's high-k layer. It is advantageous to have a thinned blocking layer during doping to prevent dissolved oxygen (which may have been in the upper portion of the thick blocking layer) from migrating to the high-k layer and adversely affecting Tivn (inverse of gate capacitance).

In a further embodiment herein referred to as "embodiment C" is, a substrate having a doped high-k in the first FET and an undoped high-k in the second FET region is made by a direct doping method. In this replacement gate integration scheme, in gate openings are formed in a dielectric layer over a first FET (future doped high-k FET) and a second FET (future undoped high-k FET). High-k layer(s) are formed in the openings. After words, a doping layer is formed directly on the high-k layer(s) followed by a multi-layered mask which is initially thick. The structure is patterned to remove the dopant and mask in the second FET region. The remaining mask on the first FET is thinned and an annealing stack is formed everywhere. An anneal migrates dopant into the high-k layer over the first FET region, but because there is no dopant layer above the second FET's high-k layer, it remains undoped. Subsequently, the annealing and doping stacks are removed and the work function metals are formed. Finally, the openings of the replacement metal gate first and second FETs are filled and planarized.

DETAILED DESCRIPTION

Indirect Doping

FIG. 1 is a flow chart of embodiments A and B of the present invention of making one doped and one undoped FET using a multi-layered blocking stack (embodiment A) or a single layer blocking stack (embodiment B) in a soft mask replacement metal gate process. In step 10 a substrate having an N-FET region and a P-FET region is provided.

Over the substrate is a dielectric layer having two openings, which preferably were made by removing a dummy gate. These openings will be over the N-FET or P-FET region of the substrate and depending high-k integration scheme, may expose the substrate ("high-k last" integration scheme), may expose an interfacial layer in contact with the substrate ("high-k last" integration scheme), or may expose a high-k dielectric previously formed over the substrate ("high-k first" integration scheme). These openings will contain the future high-k, metal gates of the FETs.

Still referring to FIG. 1, in step 20, a high-k layer is formed in the openings in a high-k last integration scheme. If a high-k first scheme is practiced, forming the high-k is skipped. Thus, in a high-k last embodiment, the high-k layer lines the sidewalls and the bottom of the openings whereas in a high-k first embodiment the high-k is only at the bottom of the opening because the high-k material was formed with the dummy gate.

In step 25, a blocking stack is formed over the substrate and the high-k layer. In embodiment A, a multi-layer blocking stack is used that will advantageously allow a blocking stack of different thicknesses to be formed and used during various steps in the process. Thus, as will explained later, the multi-layers allows the overall thickness of the blocking layer to be tuned depending upon the needs of that particular step of the process. The multi-layer approach, as will be shown later, also allows a thin blocking stack to be formed at some steps, thin stacks, without use of the multi-layer stack of this invention are which are often difficult to create. Alternatively, at step 25 in embodiment B, a single blocking layer (which is subsequently thinned) is formed rather than the multi-layered blocking stack.

Referring to step 30 of FIG. 1, the blocking stack is lithographically patterned so that it is removed from a first FET region but remains on a second FET region. As will be explained later, it is during lithographic patterning that it is important to have a thick blocking layer Referring to step 40, a portion of the blocking stack in the second FET region is removed to leave a remaining, thin blocking layer in preparation for the anneal step in which a thin layer is advantageous, as will be explained later. In step 42, a doping stack is formed everywhere including over the thinned blocking layer.

Referring to step 50, an annealing stack is formed over both regions of the substrate and an anneal diffuses the dopant into the high-k layer of the unblocked first FET. Subsequently, in step 55 the annealing stack is removed. More layers, namely the doping stack and remaining thinned blocking layer, are removed in step 60.

In step 70, the work function metals are formed in the first and second FETs regions. Finally in step 90, the openings having high-k and respective work function metals and are filled with a conductive material and planarized to yield a first FET having a doped high-k material and a second FET having an undoped high-k material. The embodiments of FIG. 1 will now be described in more detail in conjunction with FIGS. 2-12.

FIG. 2 illustrates a structure which can represent a preliminary stage in the above described method, specifically, a cross-section of the substrate at the end of step 10. As illustrated in FIG. 1, is a semiconductor substrate 100 which may be a bulk single crystalline substrate a semiconductor on insulator substrate. The substrate 100 may be planar or have fins. The substrate has a first FET region 101 and second FET region 102. In some embodiments the first region 101 may be include active semiconductor region in which an n-type field effect transistor ("NFET") is to be formed, while in some embodiments the second region 102 may include a second active semiconductor region in which a p-type field effect transistor ("PFET") is to be formed. In other embodiments both regions contain the same type of FET (e.g. both NFET or both PFET). An isolation region may separate the first and second FET regions, but is omitted from the figures for simplicity purposes.

Continuing with FIG. 2, overlying the substrate 100 is dielectric layer 105. The dielectric layer may be a single composition or may include multitude of different dielectric materials and layers. In the dielectric layer are at least two openings over the first and second FET regions of the substrate. Here, in a version of a high-k last integration scheme, the openings reveal a previously formed interfacial layer 112. The interfacial layer may contain silicon and at least one of oxygen and nitrogen. In the substrate, on either side of the opening will be previously formed source (S) and drain (D) regions of the FETs. The source and drain regions may be, embedded in the substrate, raised from the substrate or both. The source and drain regions may or may not have silicide on them at this point in the process.

Figure 3:
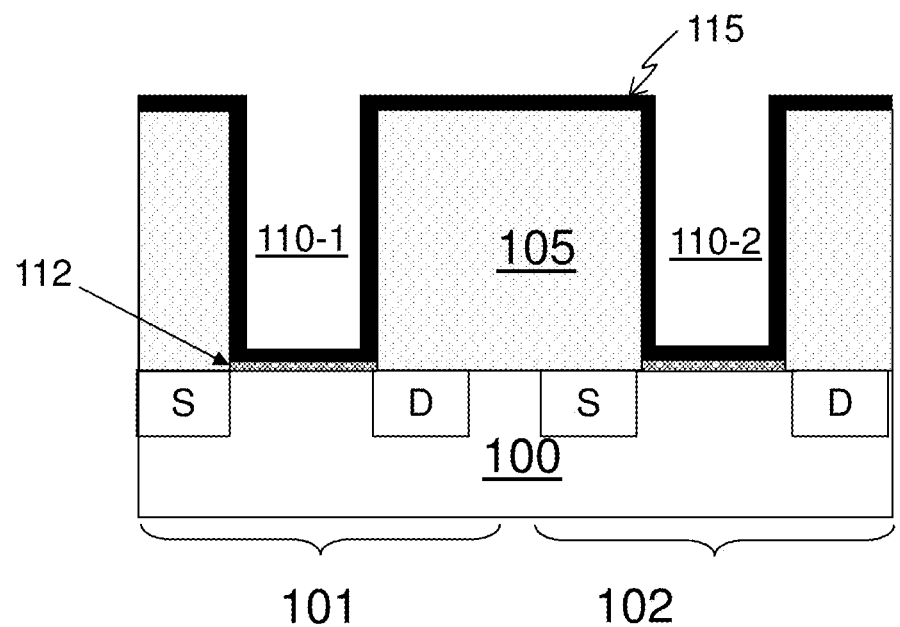
FIG. 3 is a sectional view illustrating the formation of a high-k layer according to an embodiment of a method of the present invention.

Thereafter, as shown in FIG. 3's high-k last embodiment, a high-k layer 115 can be formed overlying the interfacial layer 112 and in the first and second openings 110-1 and 110-2. Alternatively, interfacial layer 112 can be removed, and a new interfacial layer formed and/or high-k layer 115 can be formed in place of such layer. In one embodiment, the high-k layer 115 may include a high dielectric material having a dielectric constant greater than silicon dioxide and more preferably greater than silicon nitride. For example, the high-k layer 115 may include one or more of the following dielectric materials: hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. Typically, such layer may be deposited by chemical vapor deposition (CVD) or atomic layer deposition (ALD). The high-k layer 115 typically deposits onto all exposed surfaces, including lining the openings 110-1, 110-2 and overlying the first and second FET regions 101, 102, and onto the interfacial layer 112, when present within the gate openings.

Figure 4:
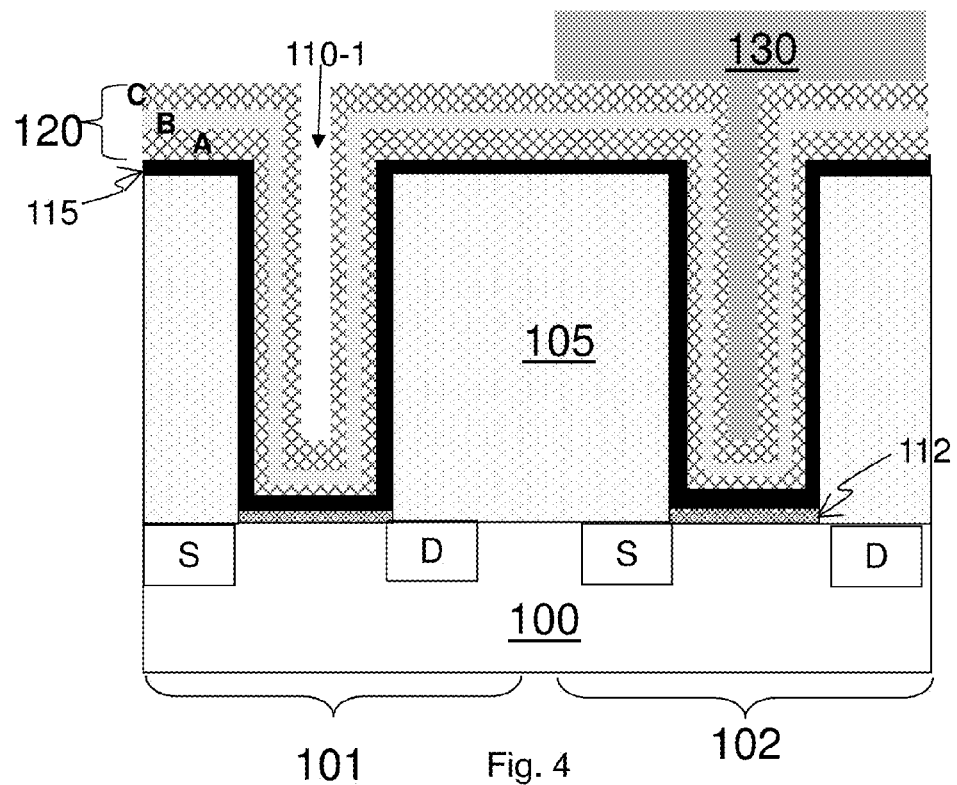
FIG. 4 is a sectional view illustrating the formation of a blocking stack and lithographic stack according to an embodiment of a method of the present invention.

Subsequently, as illustrated in FIG. 4 in accordance with an option of step 20, a multi-layered blocking layer 120 is formed over the substrate. The blocking layer includes three layers a first bottom blocking layer (A), a second middle blocking layer (B), and a third top blocking (C). In a preferred embodiment the first (bottom—A) and third (top—C) blocking layers may be titanium nitride while the second (middle—C) blocking layer is a lanthanum (La) containing material such as La or lanthanum oxide. As formed, the first (bottom—A) blocking layer may be from about 15 angstroms to 25 angstroms and ranges there between; the second (middle—B) blocking layer may be from about 5 angstroms to 15 angstroms and ranges there between; and the third (top—C) blocking layer may be from about 5 angstroms to 30 angstroms and ranges there between.

Alternatively, in accordance with embodiment B, the blocking layer 120 may be a single layer of titanium nitride which is thick enough to protect the substrate in the subsequent patterning steps. Preferably the single, thick blocking layer equal to or greater than about 25 angstroms.

Continuing with FIG. 4, a soft mask lithographic material 130 has been patterned over the substrate. Soft mask lithographic material may include one or more of the following: photoresist, an antireflective coating and an optical planarization layer (OPL) and preferably does not include a hard mask layer such as silicon dioxide or a metal hard mask. If the blocking layer were a single thin titanium nitride layer, the reactive ion etching process used to pattern the OPL would interact with the underlying high-k material of the unblocked gate (which in a future step will received a dopant to become a doped high-k FET, here the first FET) causing an increase in the interfacial layer 112 thickness which, in turn, undesirably increases the Tiny (inverse of gate capacitance). To solve this problem, in embodiment A a multi-layer blocking stack of step 20 is used whereas embodiment B uses a single thick TiN layer. As will be seen later, in each embodiment the blocking later can be later thinned. This allows the blocking layer to be initially thick to protect the high-k 115 and interfacial layers 112 during patterning of the lithographic material and later thinned which is advantageous for the dopant drive-in anneal.

Figure 5:
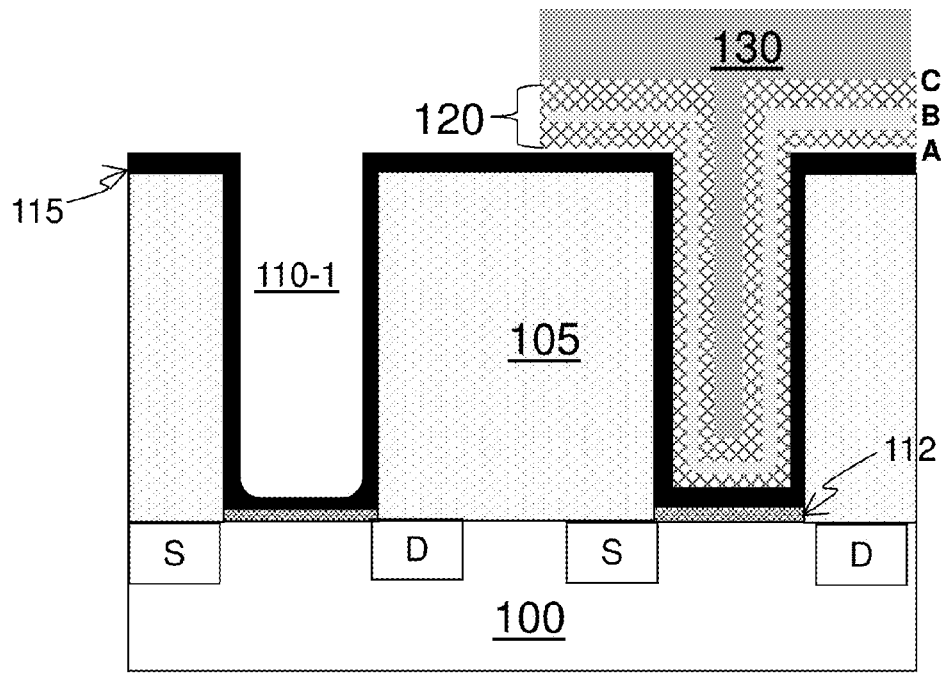
FIG. 5 is a sectional view illustrating of patterning the blocking stack and the lithographic stack according to an embodiment of a method of the present invention.

Continuing with FIG. 4 and transitioning to FIG. 5, after the lithographic patterning (shown in FIG. 4) the original blocking layer 120 has fulfilled one of its purposes (protecting the substrate during patterning) and can now be thinned in order to prepare itself for its next purpose, namely to act as a thin dopant diffusion barrier layer. First, with the lithographic material 130 patterned to expose the first FET region 101 of the substrate 100, the blocking layer 120 is removed from the first FET region 101 leaving the high-k layer 115 exposed in the first FET region 101 as depicted in FIG. 5

Figure 6:
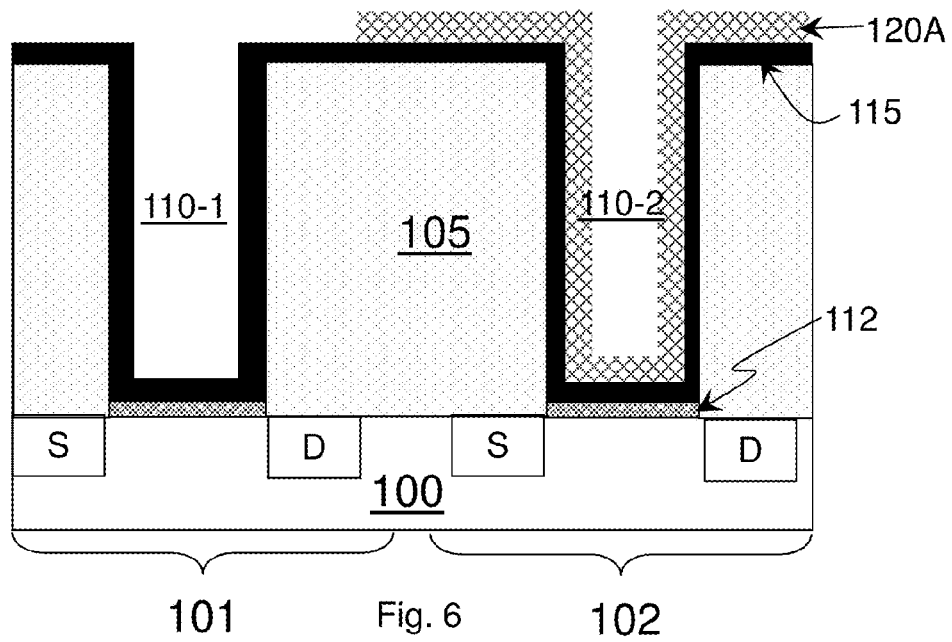
FIG. 6 is a sectional view illustrating of patterning the thinning the blocking stack according to an embodiment of a method of the present invention.

Continuing with FIG. 5 and transitioning to FIG. 6, the lithographic material 130 is removed from the second FET region 102. Now, in accordance with embodiment A, the multi-layer blocking stack 120 may be thinned by removing the top two layers, namely third (top) blocking layer 120C (titanium nitride in a preferred embodiment) and second (middle) blocking layer 120B (a lanthanum containing layer in a preferred embodiment), thereby leaving the first (bottom) blocking layer 120A (titanium nitride) over the second FET region 102 of the substrate. The remaining first blocking layer 120A may now serve as a dopant diffusion barrier in subsequent steps. The thickness of the remaining blocking layer may be from about 15 angstroms to about 25 angstroms and ranges there between.

The thinning of embodiment A's multi-layer blocking 120 stack which takes place can occur because of the unexpected finding that the middle blocking layer 120B (preferably a La containing material) will etch readily in a hot peroxide solution when it is on silicon, but is etch resistant to the same chemistry when it is on titanium nitride (as in the preferred embodiment). By taking advantage of this unexpected phenomenon the multi-layer blocking stack is able to be both thick (when protecting the first FET region during OPL patterning) and thinned when functioning as a dopant barrier. Accordingly, a series of selective etches may be used to thin the blocking layer. For example, the top blocking layer 120C may be etched in peroxide while the middle blocking layer 120B is not etched (i.e. selective removal of the TiN relative to the middle layer sacrificial layer). Then the middle blocking layer 120B may be removed with chloride containing chemistry selectively with respect to the bottom blocking layer 120A to leave the thinned blocking layer 120A.

Turning to embodiment B, if the blocking layer remained a single thick titanium nitride layer then during a subsequent anneal, the inventors have discovered that dissolved oxygen in the titanium nitride may undesirably enter the high-k layer of the undoped FET (FET with blocking material overlying it, here, the second FET). There are two possible solutions of the dissolved oxygen problem of the single thick blocking layer. One is to use a silicon dioxide hard mask to prevent oxygen from entering the TiN blocking film. However, the hard mask approach is undesirable because after patterning, HF is used to remove the hard mask. HF will attack the high-k 115 layer. Another solution is to thin the single thick blocking layer thus removing the upper portions of the layer which contain the oxygen. Unfortunately, it can be difficult to reliably and repeatably thin a single, thick TiN layer to thicknesses required during the anneal process. However, as practiced in embodiment B, the inventors have found a repeatable and controllable process (~5-10 Angstrom/min removal rate and ranges there between) to achieve such thinning. Specifically, a titanium nitride blocking film can be etched in a solution of room temperature or colder aqueous ammonia hydroxide and an aqueous hydrogen peroxide (SC1) having 50:1.5 ratio. Note that a thinned remaining block layer will be referred to as 120A regardless if it is a remaining portion of a multi-layer stack or an initially thicker single layer blocking stack.

Figure 7:
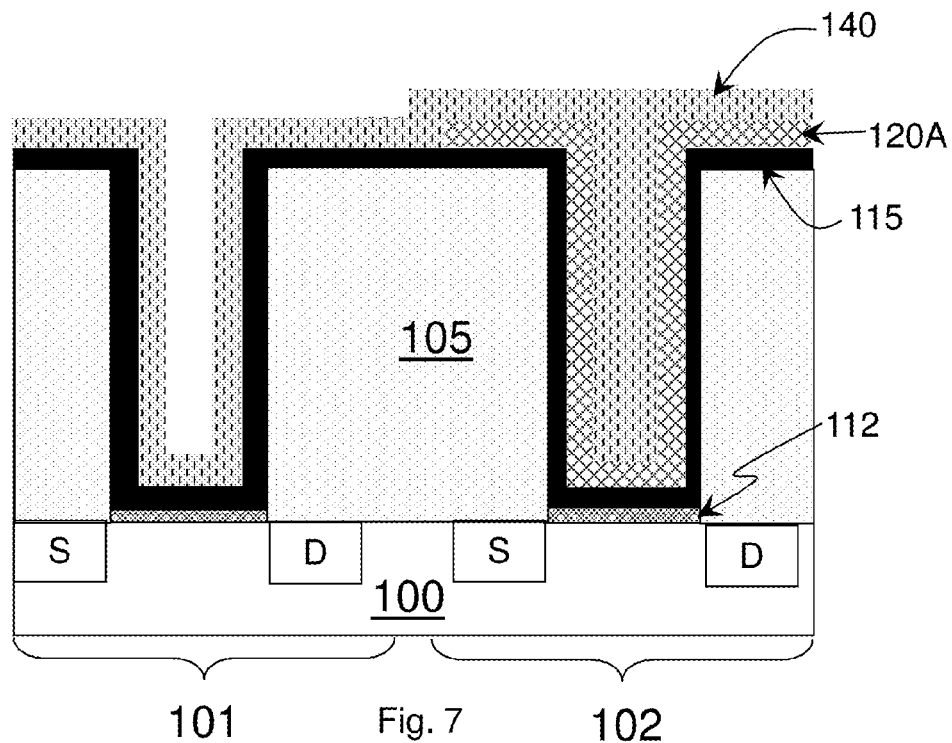
FIG. 7 is a sectional view illustrating the formation of a doping layer according to an embodiment of a method of the present invention.

Turning to FIG. 7, a dopant film stack 140 is formed over the entire surface of the substrate. Thus, the dopant film stack lines the first FET region 101 opening 110-1 and is on the high-k layer 115 in the first opening. Meanwhile, in the second FET region 102, the dopant film stack 140 is over the remaining thinned blocking layer, namely the first (bottom) blocking layer 120A. In an embodiment in which the first FET region 101 is an NFET, the dopant stack may contain lanthanum, for example as elemental lanthanum or an oxide, or an n-dopant stack may contain some other rare earth dopant such as yttrium which shifts the effective work function towards the conduction band-edge. The thickness of the dopant stack may be from about 1 Å to about 10 Å and ranges therebetween.

Figure 8:
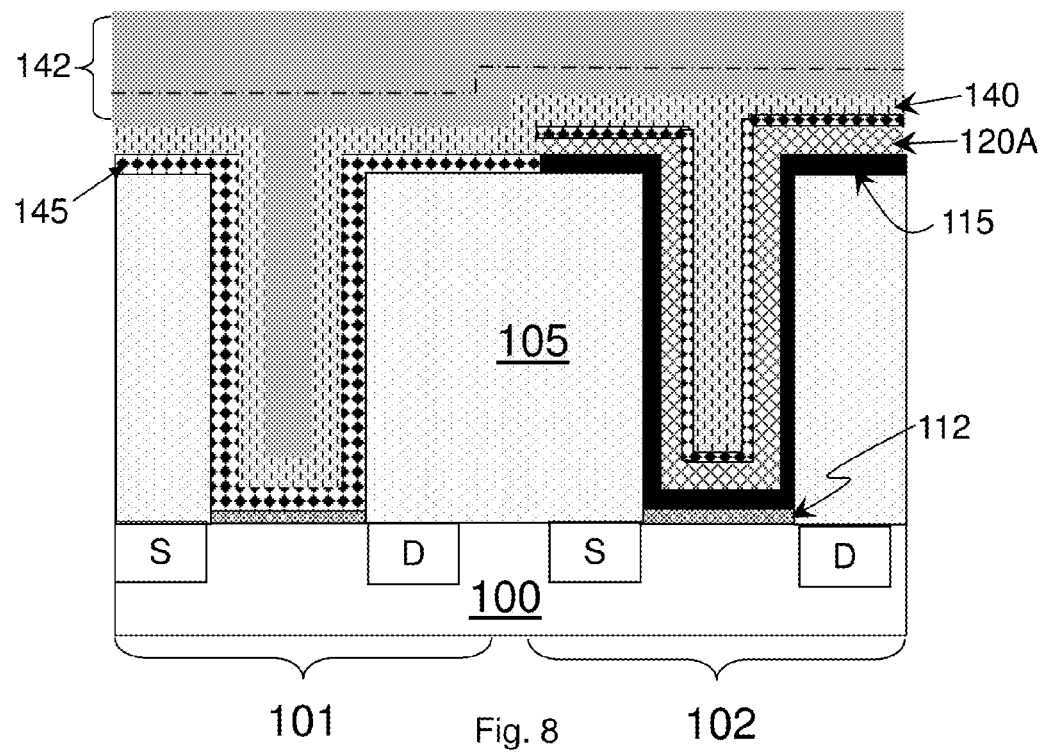
FIG. 8 is a sectional view illustrating forming an annealing stack and the substrate post annealing according to an embodiment of a method of the present invention.

Referring to FIG. 8, in addition to a dopant stack 140, and annealing stack 142 may be placed on top of the dopant stack 140. In a preferred embodiment, the annealing stack 142 may have a bottom layer, a cap titanium nitride layer, followed by an amorphous silicon layer. The amorphous silicon layer function to block oxygen from reaching the high-k during the anneal which would adversely impact Tinv (increase). The cap titanium nitride layer functions to prevent the silicon from forming a silicide with the high-k layer 115 and/or dopant layer.

Still referring to FIG. 8, with the dopant stack 140 and annealing stacks 142 in place, the substrate 100 is annealed to drive the dopant into the high-k 115 of the first FET region 101. The anneal may be from about 800 C to about 1300 C and ranges therebetween. If the temperature is too low the dopants will not diffuse sufficiently into the high-k material 115 and there will be no shift in the threshold voltage of the first FET. If the temperature is too high, too much dopant moves close to the substrate 100 causing a change in crystallization of the high-k material which may lead to severe gate leakage. The anneal may be performed by a soak anneal (several seconds), spike/rapid thermal anneal (RTA) which is a few seconds, or a laser anneal (LSA) which is milliseconds. Typically, the anneal is performed in inert ambient such as nitrogen and/or argon.

Still referring to FIG. 8, the substrate 100 is shown after the anneal. Here, the dopant has moved into the high-k layer of the first region 101 to become the doped high-k 145. Preferably the dopant in the high-k is concentrated near the interfacial layer/high-k interface. Also, FIG. 8 a similar cross-hatching as the doped high-k 145 indicates that the top of the thinned, remaining blocking layer 120A may also absorb some dopant, but note that the dopant does not reach the high-k 115 in the second FET regions 102 which remains undoped.

Figure 9:
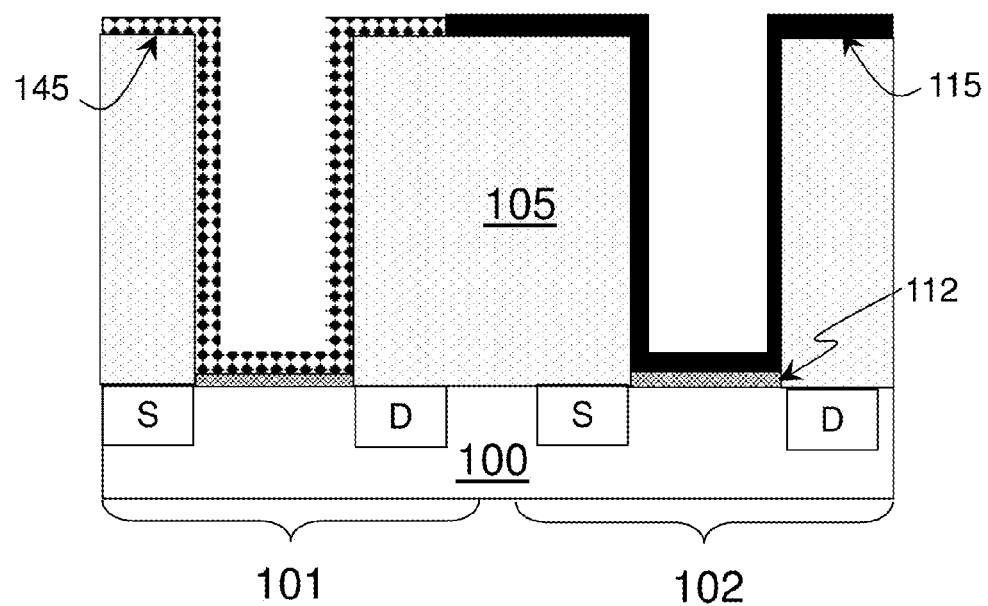
FIG. 9 is a sectional view illustrating the substrate after removing annealing, mask and doping layers according to an embodiment of a method of the present invention.

Turning to FIG. 9, annealing stack 142, dopant stack 140 and the remaining thinned blocking layer 120A are removed. Removal is by a sequence of wets processes, typically involving ammonia based chemistry to remove silicon, peroxide and HCl and ammonia based chemistries (SC1, SC2) to remove the TiN and the dopant materials. Choice of chemistry is motivated by efficiency in removing these materials while retaining high selectivity to the high-k materials (doped 145 and undoped 115). Thus, FIG. 8 shows a doped high-k 145 in the first FET region 101, while the high-k 115 in the second FET region 102 remains undoped.

Figure 10:
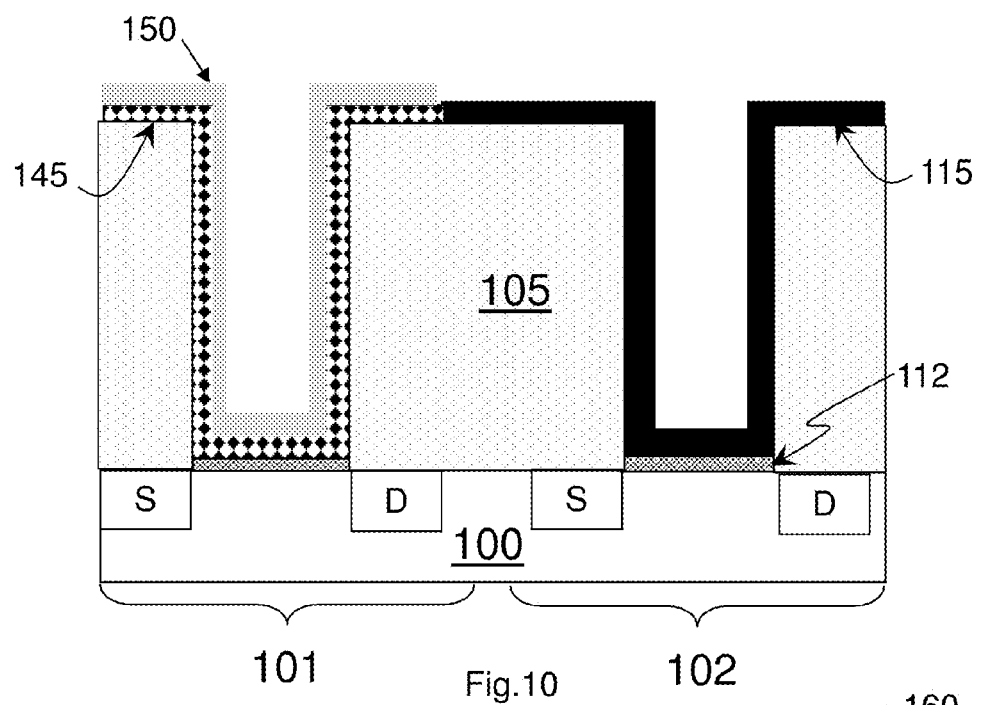
FIG. 10 is a sectional view illustrating the substrate after patterning a first work function metal stack according to an embodiment of a method of the present invention.

Referring to FIG. 10, a first work function metal stack 150 is formed everywhere and then patterned so that it only remains over the first FET region 101, including the doped high-k 145. In one embodiment, the first and second FET regions, 101 and 102, may be an opposite type FETs. Therefore, in an embodiment in which the first FET region 101 is an N-FET, the first work function metal stack may include one or more of a titanium nitride film and a film containing one or more of the following elements: titanium, aluminum and carbon to form a metallic film. The work function stack may include underlying barrier and/or overlying capping layers in addition to work function adjustment material.

Figure 11:
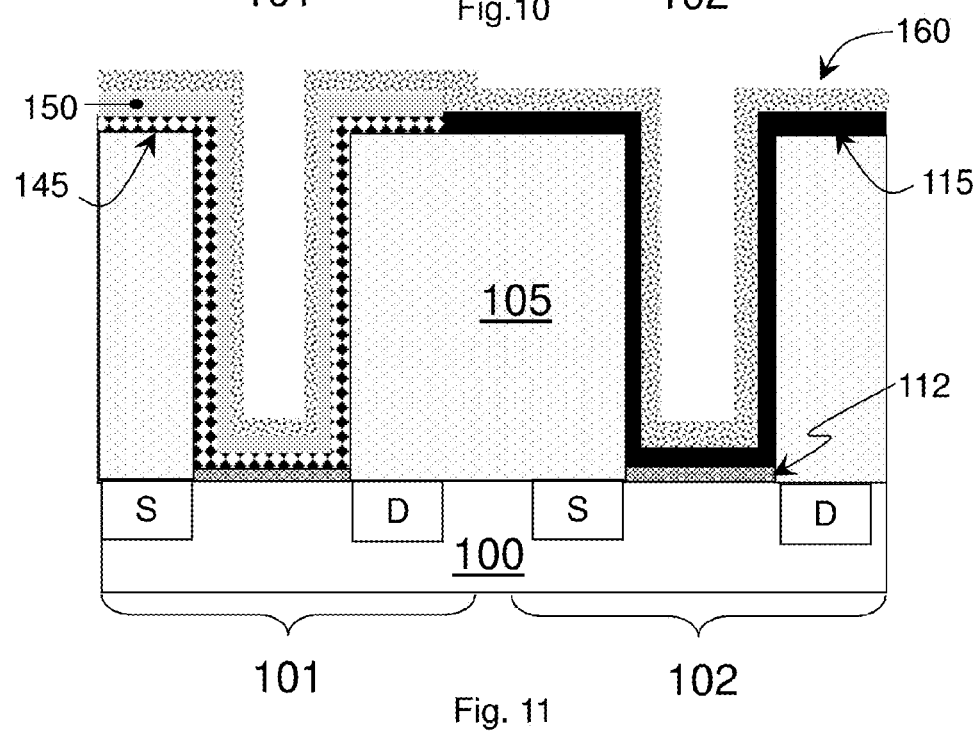
FIG. 11 is a sectional view illustrating the substrate after forming a second work function metal stack according to an embodiment of a method of the present invention.

Referring to FIG. 11, a further stage of fabrication in which a second work function metal stack 160 suitable for setting a workfunction for the second FET region 102, is formed everywhere. As shown in FIG. 11, the second work function stack 160 remains everywhere, but in an alternate embodiment, the second work function stack 160 may be patterned so it remains only in the second FET region 102 (a P-FET, continuing with the example from above). With respect to a P-FET example, suitable work function stack materials may include one or more layers of titanium nitride.

The preceding work function metal formation formed the first, here N-FET work function materials prior to the second work function metals, here P-FET. However, the order could be reversed as will be shown in conjunction with another embodiment.

Figure 12:
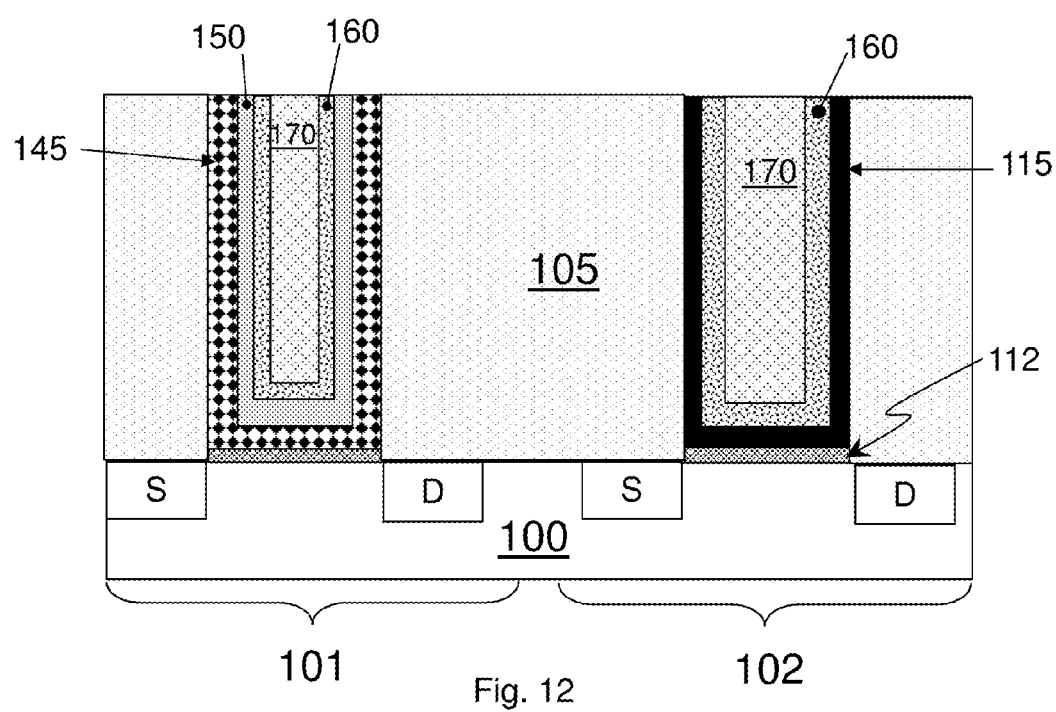
FIG. 12 is a sectional view illustrating the substrate after filling openings according to an embodiment of a method of the present invention.

Thereafter, referring to FIG. 12, further processing can be performed to complete the gates of the NFET and the PFET. Specifically, a fill stack 170 is formed in the openings and planarized. Fill stack 170 may include several layers including a metal seal layer, a wetting layer, and a seed layer and a bulk fill layer can be deposited. Not every layer is needed in all cases. In one embodiment, the wetting layer may be titanium nitride and the bulk fill layer can be tungsten. Specifically, in the example illustrated in FIG. 12, the second work function metal 160 serves two roles: it is a work function metal of the second FET region 102 and wetting layer prior to bulk fill of both FET regions 101 and 102.

Direct Doping Using Multi-Layered Mask

FIG. 13 is a flow chart of a method of making one doped and one undoped FET using a multi-layered mask. In step 10 a substrate having an N-FET region and a P-FET region is provided. Over the substrate is a dielectric layer having two openings, which preferably were made by removing a dummy gate. These openings will be over the N-FET or P-FET region of the substrate and depending high-k integration scheme, may expose the substrate ("high-k last" integration scheme), may expose an interfacial layer in contact with the substrate ("high-k last" integration scheme), or may expose a high-k dielectric previously formed over the substrate ("high-k first" integration scheme). These openings will contain the future high-k, metal gates of the FETs. The substrate may be planar or have fins.

Still referring to FIG. 13, in step 20, a high-k layer is formed in the openings in a high-k last integration scheme. If a high-k first scheme is practiced, forming the high-k is skipped. Thus, in a high-k last embodiment, the high-k layer lines the sidewalls and the bottom of the openings whereas in a high-k first embodiment the high-k is only at the bottom of the opening because the high-k material was formed with the dummy gate. In step 22, a doping layer is formed on the high-k material.

In step 25, a mask is formed over the substrate and the high-k layer. In one embodiment, a multi-layer mask is used that will advantageously allow a mask of different thicknesses to be formed and used during various steps in the process. Thus, as will explained later, the multi-layers allows the overall thickness of the hard mask layer to be tuned depending upon the needs of that particular step of the process. The multi-layer approach, as will be shown later, also allows a thin mask to be formed at some steps, thin stacks, without use of the multi-layer stack of this invention are often difficult to create.

Referring to step 30 of FIG. 13, the mask is lithographically patterned so that it is removed from a second FET region but remains on a first FET region. As will be explained later, it is during lithographic patterning that it is important to have a thick mask.

Referring to step 40, a portion of the mask in the first FET region is removed to leave a remaining, thin mask layer in preparation for the anneal step.

Referring to step 50, an annealing stack is formed over both regions of the substrate and an anneal diffuses the dopant into the high-k layer of the unblocked first FET. Subsequently, in step 55 the annealing stack is removed. More layers, namely the doping stack and remaining thinned hard mask layer, are removed in step 60.

In step 70, the work function metals are formed in the first and second FETs regions. Finally in step 90, the openings having high-k and respective work function metals and are filled with a conductive material and planarized to yield a first FET having a doped high-k material and a second FET having an undoped high-k material. The embodiments of FIG. 13 will now be described in more detail in conjunction with FIGS. 2-14.

Figure 14:
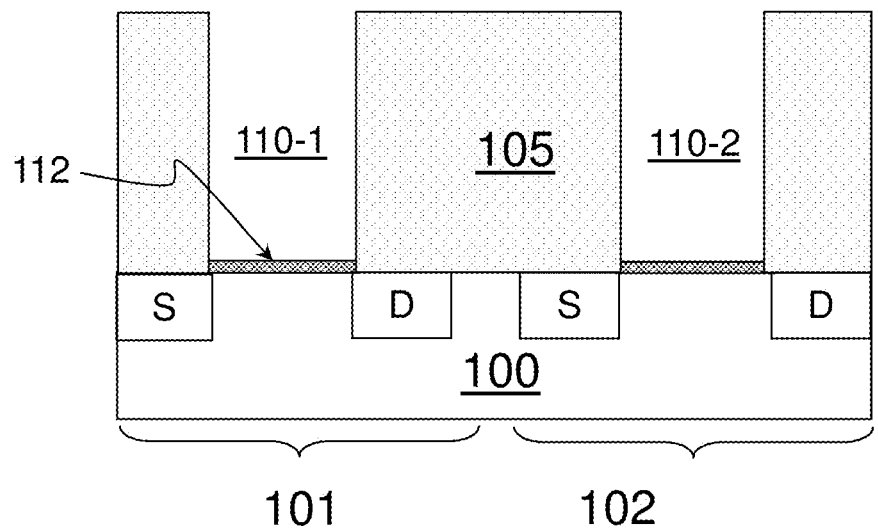
FIG. 14 is a sectional view illustrating a possible starting point in an embodiment of a method of the present invention.

FIG. 14 illustrates a structure which can represent a preliminary stage in the above described method, specifically, a cross-section of the substrate at the end of step 10. As illustrated in FIG. 13, is a semiconductor substrate 100 which may be a bulk single crystalline substrate a semiconductor on insulator substrate. The substrate 100 may be planar or have fins. The substrate has a first FET region 101 and second FET region 102. In some embodiments the first region 101 may be include active semiconductor region in which an n-type field effect transistor ("NFET") is to be formed, while in some embodiments the second region 102 may include a second active semiconductor region in which a p-type field effect transistor ("PFET") is to be formed. In other embodiments both regions contain the same type of FET (e.g. both NFET or both PFET). An isolation region may separate the first and second FET regions, but is omitted from the figures for simplicity purposes.

Continuing with FIG. 14, overlying the substrate 100 is dielectric layer 105. The dielectric layer may be a single composition or may include multitude of different dielectric materials and layers. In the dielectric layer are at least two openings over the first and second FET regions of the substrate. Here, a version of a high-k last integration scheme is illustrated, the openings reveal a previously formed interfacial layer 112. The interfacial layer may contain silicon and at least one of oxygen and nitrogen. In the substrate, on either side of the opening will be previously formed source (S) and drain (D) regions of the FETs. The source and drain regions may be, embedded in the substrate, raised from the substrate or both. The source and drain regions may or may not have silicide on them at this point in the process.

Figure 15:
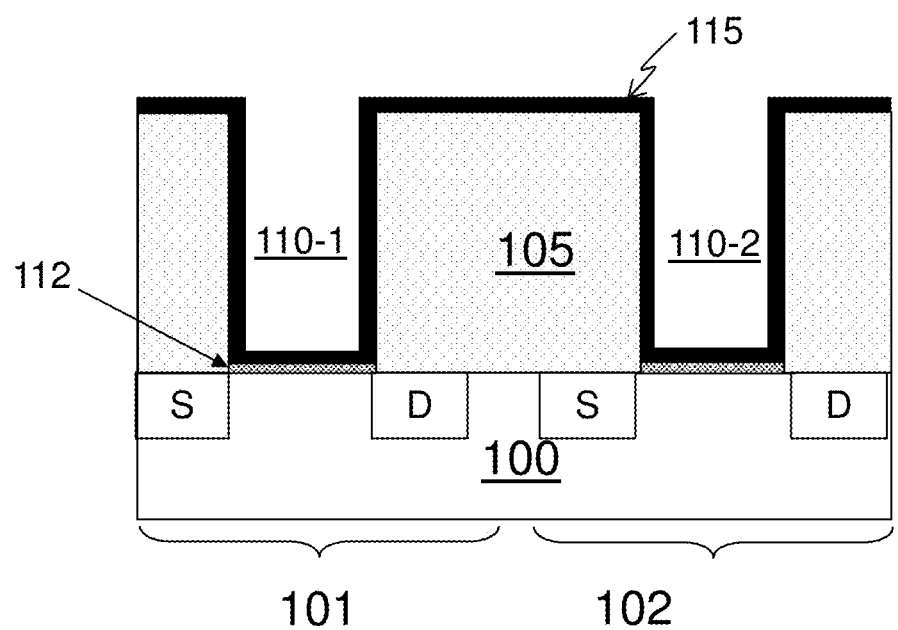
FIG. 15 is a sectional view illustrating the formation of a high-k layer according to an embodiment of a method of the present invention.

Thereafter, as shown in FIG. 15's high-k last embodiment, a high-k layer 115 can be formed overlying the interfacial layer 112 and in the first and second openings 110-1 and 110-2. Alternatively, interfacial layer 112 can be removed, and a new interfacial layer formed and/or high-k layer 115 can be formed in place of such layer. In one embodiment, the high-k layer 115 may include a high dielectric material having a dielectric constant greater than silicon dioxide and more preferably greater than silicon nitride. For example, the high-k layer 115 may include one or more of the following dielectric materials: hafnium oxide, hafnium silicon oxide, lanthanum oxide, lanthanum aluminum oxide, zirconium oxide, zirconium silicon oxide, titanium oxide, tantalum oxide, barium strontium titanium oxide, barium titanium oxide, strontium titanium oxide, yttrium oxide, aluminum oxide, lead scandium tantalum oxide, and lead zinc niobate. The layer may be deposited by chemical vapor deposition (CVD) or atomic layer deposition (ALD). The high-k layer 115 may form on all exposed surfaces, including lining the openings 110-1, 110-2 and overlying the first and second FET regions 101, 102, and on the interfacial layer 112, when present within the gate openings.

Figure 16:
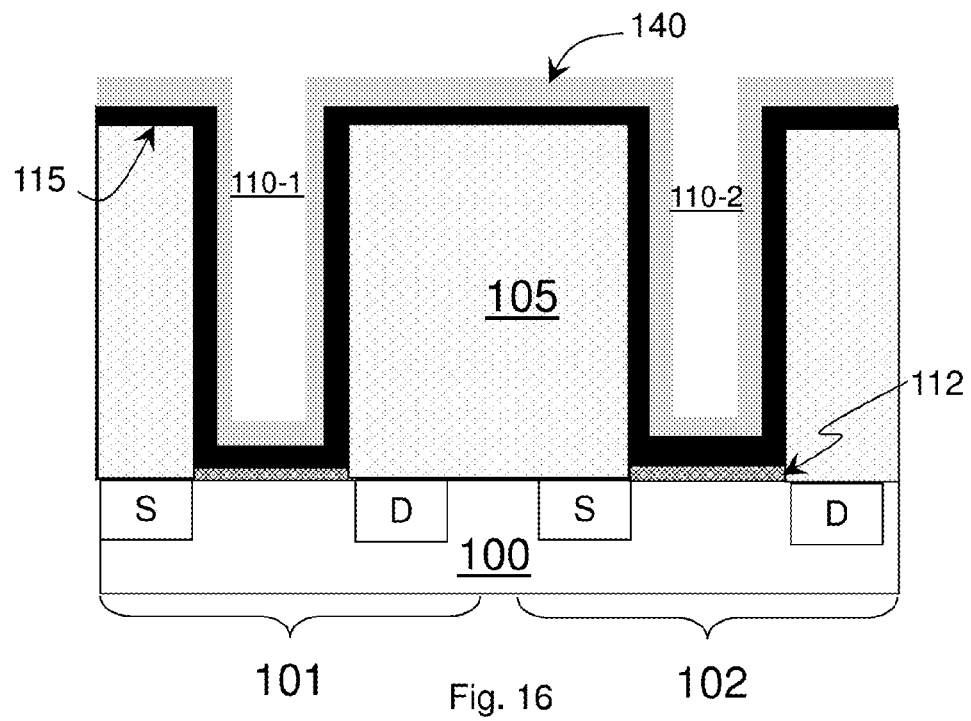
FIG. 16 is a sectional view illustrating the formation of a dopant layer according to an embodiment of a method of the present invention.

Referring to FIG. 16, a doping layer 140 is formed over the substrate. In an embodiment in which the first FET region 101 is an NFET, the dopant stack may contain lanthanum, for example as elemental lanthanum or an oxide, or an n-dopant stack may contain some other rare earth dopant such as yttrium which shifts the effective work function towards the conduction band-edge. The thickness of the dopant stack may be from about 1 Å to about 10 Å and ranges therebetween. In an embodiment in which the first FET region 101 is PFET, the dopant may include aluminum.

Figure 17:
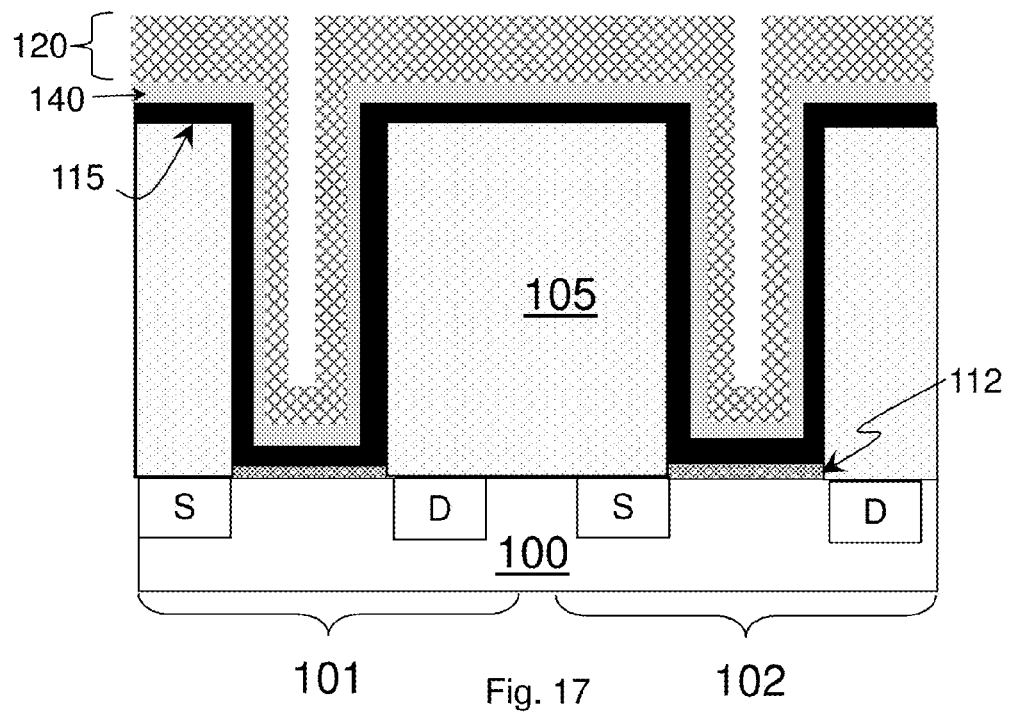
FIG. 17 is a sectional view illustrating the formation of a mask stack according to an embodiment of a method of the present invention.

Subsequently, as illustrated in FIG. 17, a multi-layered mask 120 is formed over the substrate. For simplicity, in FIG. 17, the mask 120 is shown in one large layer, however, the mask is multi-layered and includes three layers a first bottom mask layer, a second middle mask layer, and a third top mask (one may also refer to FIG. 4, for an example in which a multi-layer structure is explicitly shown and is also appropriate in the present embodiment). In a preferred embodiment the first (bottom) and third (top) mask layers may be titanium nitride while the second (middle) mask layer is a lanthanum (La) containing material such as La or lanthanum oxide. As formed, the first (bottom) mask layer may be from about 15 Å to 25 Å and ranges there between; the second (middle) mask layer may be from about 5Å to 15 Å and ranges there between; and the third (top) mask layer may be from about 5Å to 30 Å and ranges there between.

Figure 18:
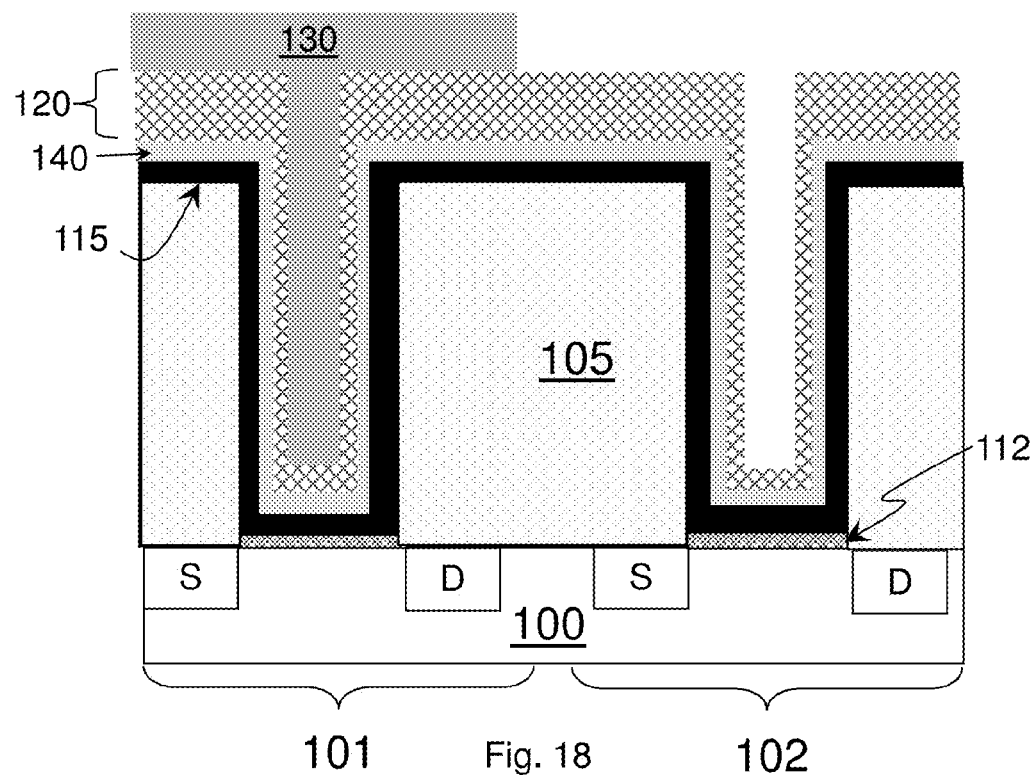
FIG. 18 is a sectional view illustrating of patterning a lithographic stack according to an embodiment of a method of the present invention.

Referring to FIG. 18, a lithographic material 130 has been patterned over the substrate. The lithographic material may include one or more of the following: photoresist, an anti-reflective coating and an optical planarization layer (OPL) and preferably does not include a mask layer such as silicon dioxide or a metal mask. Thus, the lithographic material 130 is preferably a stack of soft-mask materials. In a preferred embodiment, the OPL layer is directly on top of the multi-layered mask.

In the present invention, under the soft mask lithographic material 130, is the previously deposited multi-layer layer mask 120. If the mask layer 120 were a single thin titanium nitride layer (for example, less than 15 Å), the reactive ion etching process used to pattern the OPL would interact with the underlying high-k material (particularly on the second FET region 102 in which there is no intervening dopant layer 140) causing an increase in the interfacial layer 112 thickness which, in turn, undesirably increases the Tinv (inverse of gate capacitance). To reduce the interaction of the soft mask removal and gate dielectric degradation, the current invention employs a multi-layer mask between the soft mask lithographic materials and the high-k. As will be seen later, the mask later can be later thinned. This allows the mask layer to be initially thick to protect the high-k 115 and interfacial layers 112 during patterning of the lithographic material and later thinned which is advantageous for the dopant drive-in anneal.

Figure 19:
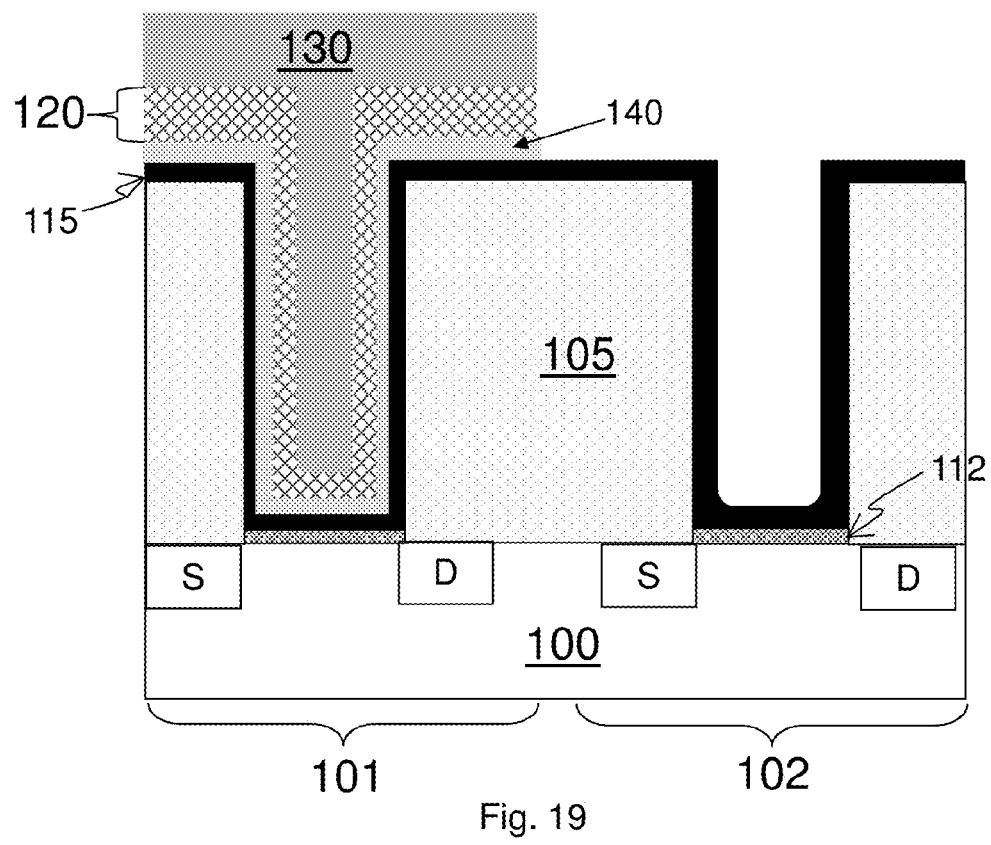
FIG. 19 is a sectional view illustrating of patterning the dopant layer according to an embodiment of a method of the present invention.

Continuing with FIG. 18 and transitioning to FIG. 19, after patterning the lithographic materials 130 in FIG. 18, the original multi-layer mask layer 120 has fulfilled one of its purposes (protecting the substrate during patterning) and can now be thinned in preparation for the subsequent high-k and dopant drive in anneal. First, with the lithographic material 130 patterned to expose the second FET region 102 of the substrate 100, the multi-layer mask layer 120 is removed from the second FET region 102 leaving the high-k layer 115 exposed in the second FET region 102 as depicted in FIG. 19.

Figure 20:
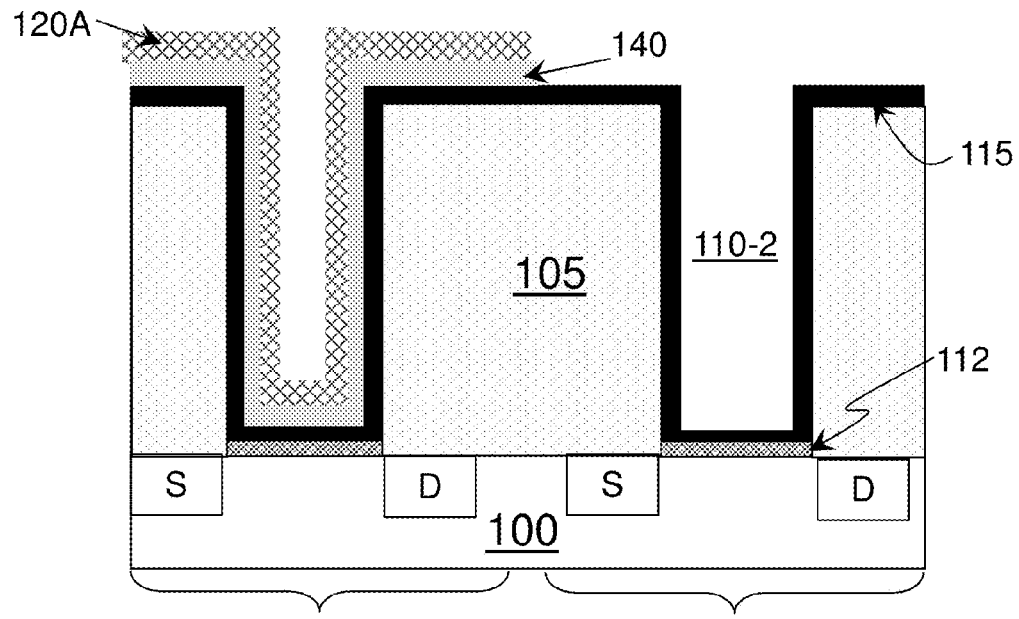
FIG. 20 is a sectional view illustrating of thinning the mask stack according to an embodiment of a method of the present invention.

Continuing with FIG. 19 and transitioning to FIG. 20, the patterned lithographic material 130 is removed from the first FET region 101. Now, in accordance with one embodiment, the multi-layer mask 120 in the first FET region 101 may be thinned by removing the top two layers, namely third (top) mask layer (titanium nitride in a preferred embodiment) and second (middle) mask layer (a lanthanum containing layer in a preferred embodiment), thereby leaving the first (bottom) mask layer (titanium nitride in a preferred embodiment) over the first FET region 101 of the substrate. The remaining portion of the multi-layer hardmask will now be referred to as reference numeral 120A and is the first (bottom) layer of the original multi-layered hardmask. The thickness of the remaining mask layer 120A may be from about 15 angstroms to about 25 angstroms and ranges there between.

The thinning of the multi-layer mask 120 stack which takes place can occur because of the unexpected finding that the middle mask layer 120 (preferably a La containing material) will etch readily in a hot peroxide solution when it is on silicon, but is etch resistant to the same chemistry when it is on titanium nitride (as in the preferred embodiment). Thus, the top mask layer can be removed selective to the middle by using the hot peroxide solution. Then the middle mask layer can be removed selective to the bottom mask layer using a chlorine containing acid. By taking advantage of this unexpected phenomenon the multi-layer mask is able to be both thick (when protecting the first FET region during OPL patterning) and later thinned.

A multi-layered hardmask 120 which is subsequently thinned, is preferable to an original single thick titanium nitride mask layer because a single thick TiN layer has dissolved oxygen which accumulates due to the lithographic patterning and removal. During a subsequent anneal, the dissolved oxygen present in the titanium nitride may undesirably enter the high-k layer of the FET with mask material overlying it (here, the first FET). To solve the dissolved oxygen problem of the single thick mask layer, a silicon dioxide mask over the TiN may be used to prevent oxygen from entering the TiN mask film. However, the silicon dioxide mask approach is undesirable because after patterning, HF is used to remove silicon dioxide mask. HF will also attack the high-k 115 layer. Another solution of the dissolved oxygen in single thick TiN layer is to thin the single thick mask layer thus removing the upper portions of the layer which contain the oxygen. Unfortunately, it can be difficult to reliably and repeatedly thin a single, thick TiN layer. Thus, the solution of the present invention, using a multi-layered hardmask solves the dissolved oxygen problem, does not require an HF etch (thus preserving the high-k) and allows controllable removal of the multi-layered mask.

Figure 21:
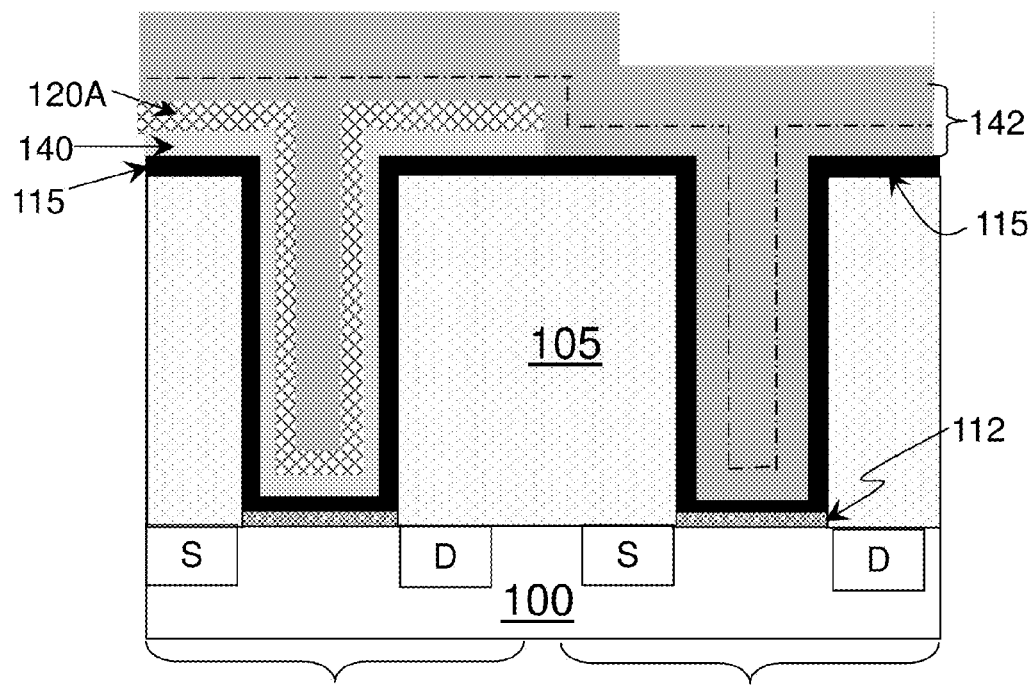
FIG. 21 is a sectional view illustrating forming an annealing stack according to an embodiment of a method of the present invention.

Referring to FIG. 21, an annealing stack 142 may be placed on top of the substrate. In particular, the annealing stack 142 is on the thinned layer 120A in the first FET region 101 and on the high-k 115 in the second FET region 102. In a preferred embodiment, the annealing stack 142 may have a bottom layer which may be referred to as a cap titanium nitride layer, followed by an amorphous silicon layer. The amorphous silicon layer function to block oxygen from reaching the high-k during the anneal which would adversely impact Tinv (increase). The cap titanium nitride layer functions to prevent the silicon from forming a silicide with the high-k layer 115 in the second FET region 102.

Figure 22:
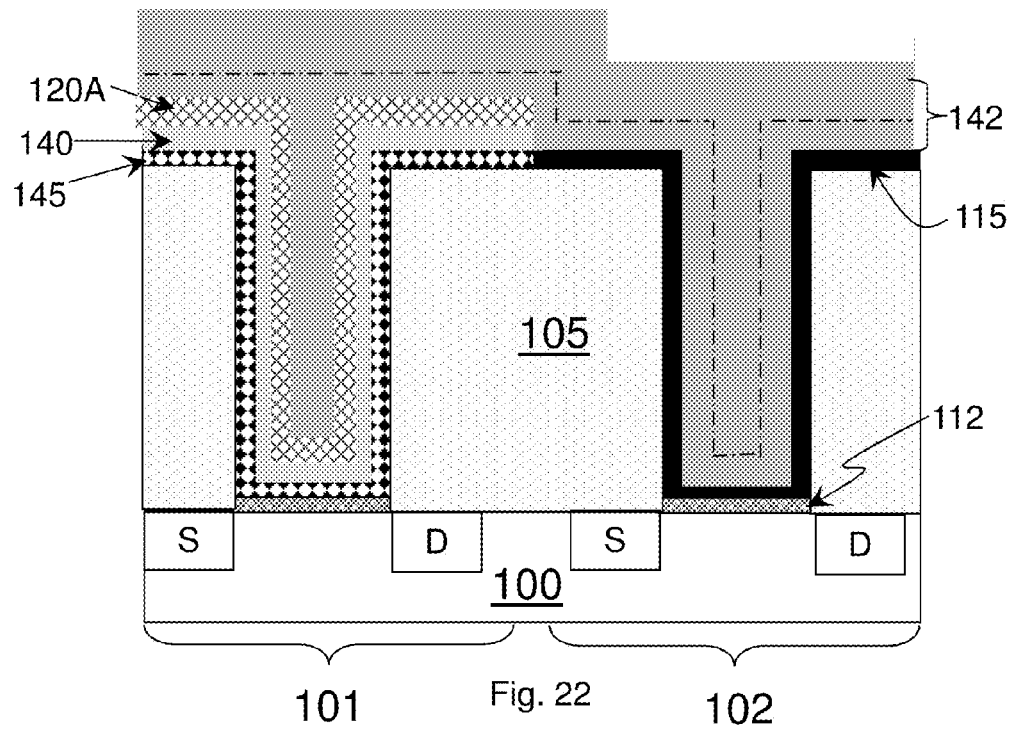
FIG. 22 is a sectional view illustrating the substrate after annealing according to an embodiment of a method of the present invention.

Referring to FIG. 22, with the dopant stack 140 and annealing stacks 142 in place, the substrate 100 is annealed to drive the dopant into the high-k 115 of the first FET region 101. The anneal may be from about 800 C to about 1300 C and ranges therebetween. If the temperature is too low the dopants will not diffuse sufficiently into the high-k material 115 and there will be no shift in the threshold voltage of the first FET. If the temperature is too high, too much dopant moves close to the substrate 100 causing a change in crystallization of the high-k material which may lead to severe gate leakage. The anneal may be performed by a soak anneal (several seconds), spike/rapid thermal anneal (RTA) which is a few seconds, or a laser anneal (LSA) which is milliseconds. Typically, the anneal is performed in inert ambient such as nitrogen and/or argon.

Still referring to FIG. 22, the substrate 100 is shown after the anneal. Here, the dopant has moved into the high-k layer of the first region 101 to become the doped high-k 145. Preferably the dopant in the high-k is concentrated near the interfacial layer/high-k interface. In the second FET regions 102, the high-k 115 remains undoped because the dopant layer was previously patterned and removed above the second FET region 102.

Figure 23:
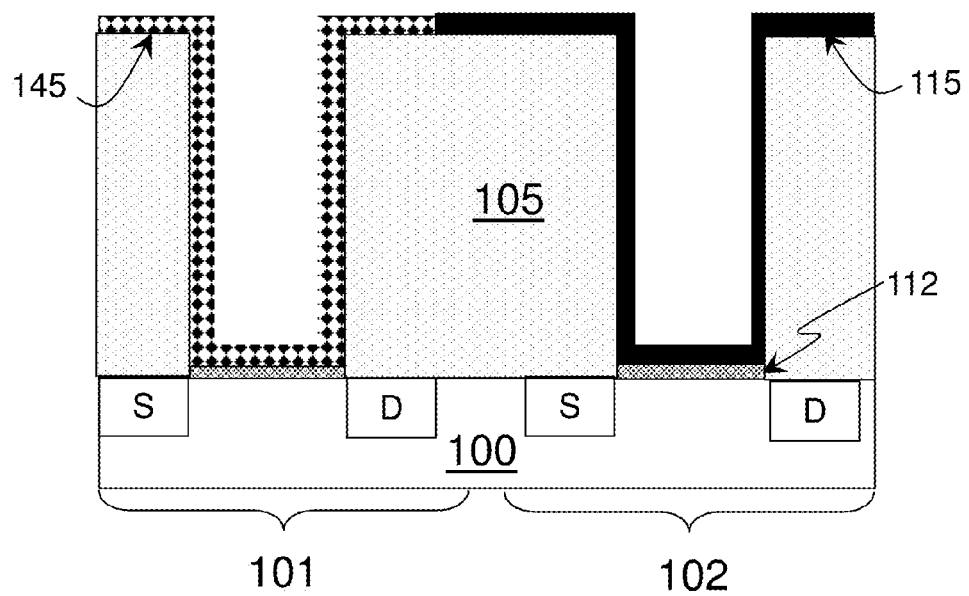
FIG. 23 is a sectional view illustrating the substrate after removing annealing, mask and doping layers according to an embodiment of a method of the present invention.

Turning to FIG. 23, annealing stack 142, dopant stack 140 and the remaining thinned mask layer 120A are removed. Removal is by a sequence of wets processes, typically involving ammonia based chemistry to remove silicon, peroxide and HCl and ammonia based chemistries (SC1, SC2) to remove the TiN and the dopant materials. Choice of chemistry is motivated by efficiency in removing these materials while retaining high selectivity to the high-k materials (doped 145 and undoped 115). Thus, FIG. 23 shows a doped high-k 145 in the first FET region 101, while the high-k 115 in the second FET region 102 remains undoped.

Figure 24:
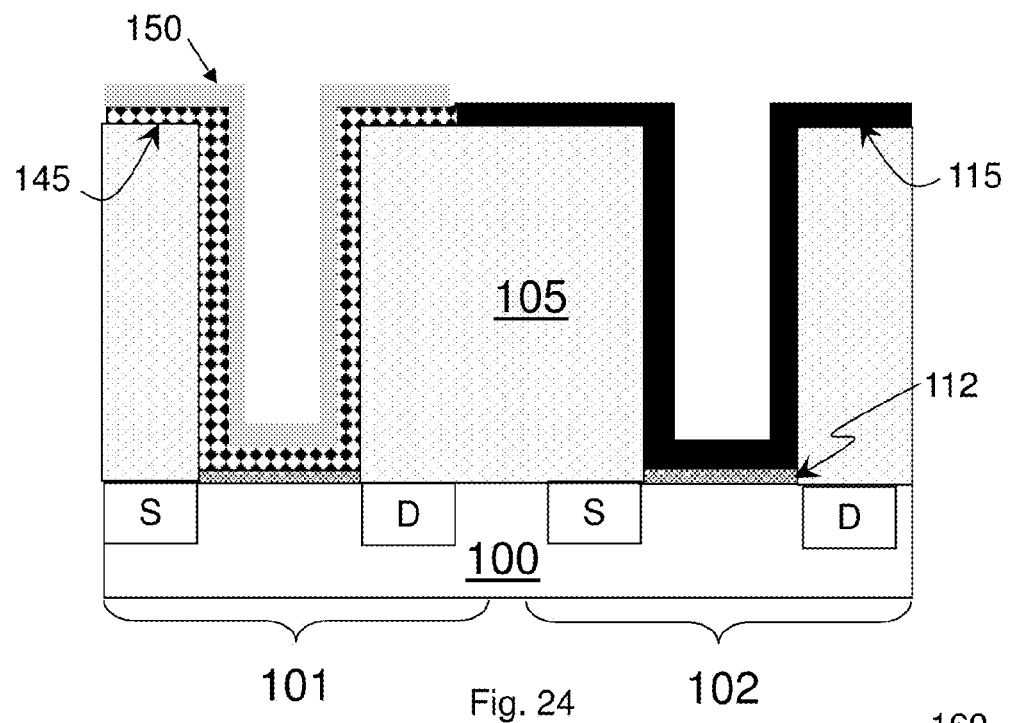
FIG. 24 is a sectional view illustrating the substrate after patterning a first work function metal stack according to an embodiment of a method of the present invention.

Referring to FIG. 24, a first work function metal stack 150 is formed everywhere and then patterned so that it only remains over the first FET region 101, including the doped high-k 145. In one embodiment, the first and second FET regions, 101 and 102, may be an opposite type FETs. Therefore, in an embodiment in which the first FET region 101 is an N-FET, the first work function metal stack may include one or more of a titanium nitride film and a film containing one or more of the following elements: titanium, aluminum and carbon to form a metallic film. The work function stack may include underlying barrier and/or overlying capping layers in addition to work function adjustment material.

Figure 25:
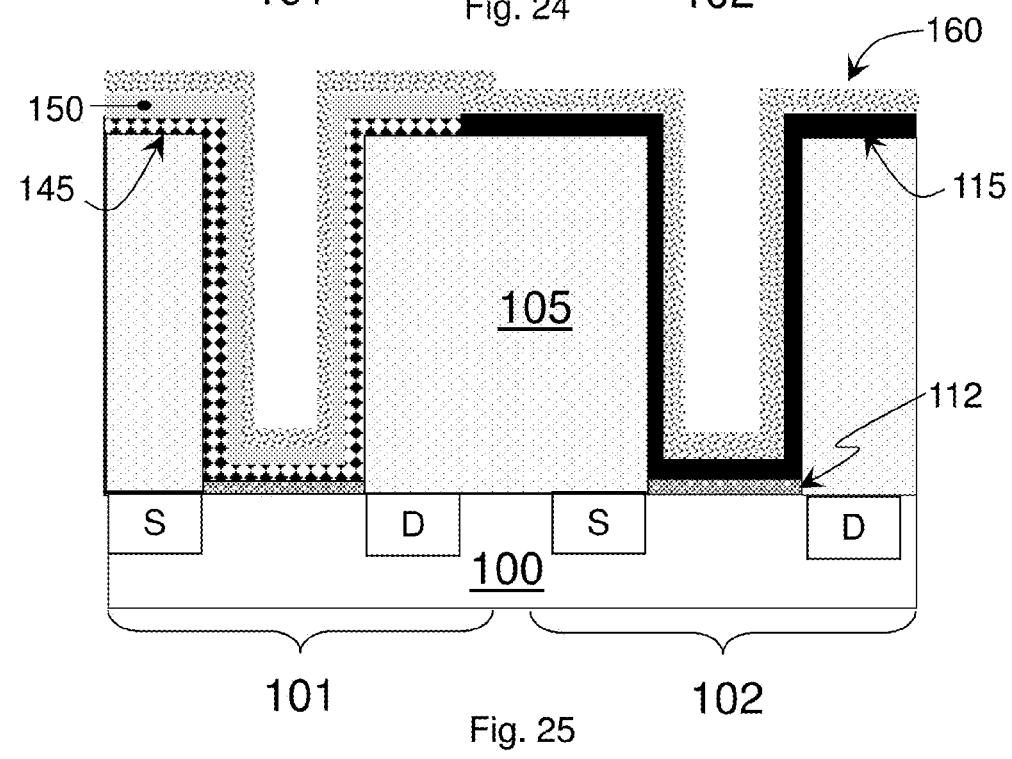
FIG. 25 is a sectional view illustrating the substrate after forming a second work function metal stack according to an embodiment of a method of the present invention.

Referring to FIG. 25, a further stage of fabrication in which a second work function metal stack 160 suitable for setting a workfunction for the second FET region 102, is formed everywhere. As shown in the embodiment of FIG. 13, the second work function metal stack remains in both the first and second FET regions, 101 and 102, respectively, however, alternate embodiments may remove the second work function 160 metal stack from the first FET region 101. When the second FET region 102 is a P-FET, suitable second work function stack 160 materials may include one or more layers of titanium nitride.

The preceding work function metal formation formed the first, here N-FET work function materials prior to the second work function metals, here P-FET. However, the order could be reversed.

Figure 26:
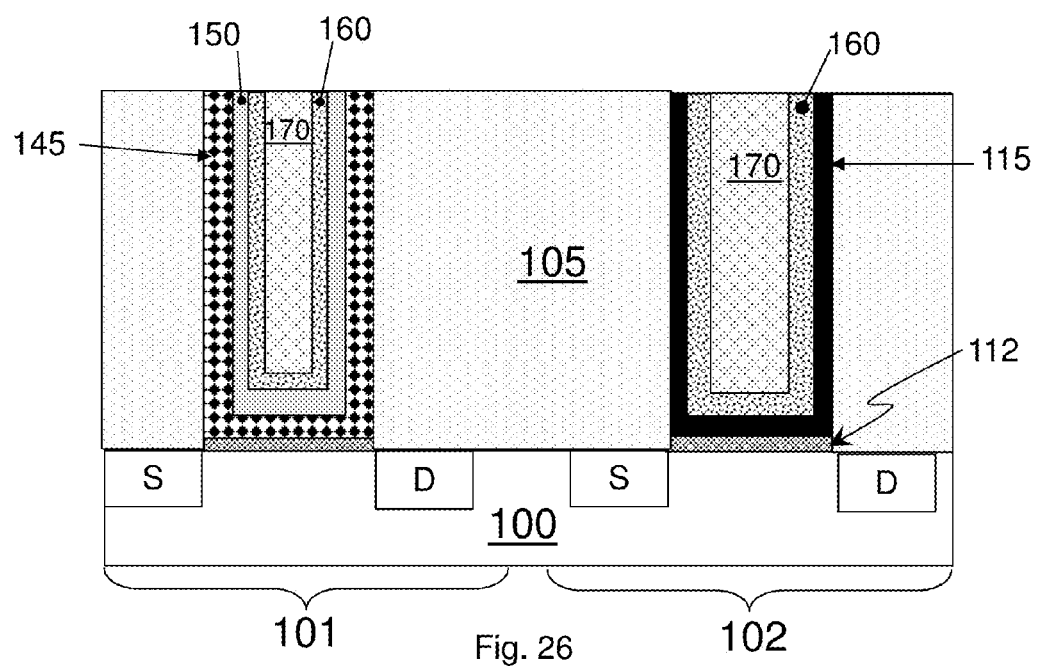
FIG. 26 is a sectional view illustrating the substrate after filling openings according to an embodiment of a method of the present invention.

Thereafter, referring to FIG. 26, further processing can be performed to complete the gates of the NFET and the PFET. Specifically, a fill stack 170 is formed in the openings and planarized. Fill stack 170 may include several layers including a metal seal layer, a wetting layer, and a seed layer and a bulk fill layer can be deposited. Not every layer is needed in all cases. In one embodiment, the wetting layer may be titanium nitride and the bulk fill layer can be tungsten. Specifically, in the example illustrated in FIG. 14, the second work function metal 160 serves two roles: it is a work function metal of the second FET region 102 and wetting layer prior to bulk fill of both FET regions 101 and 102.

While the invention of making doped and undoped FETs with a multi-layer mask has been described in accordance with certain preferred embodiments thereof, those skilled in the art will understand the many modifications and enhancements which can be made thereto without departing from the true scope and spirit of the invention, which is limited only by the claims appended below.

The invention claimed is:

1. A method of fabricating doped FET and an undoped FET in a replacement metal gate process, the method comprising:
    forming first and second openings in a dielectric layer overlying first and second FET regions of a substrate thereby forming first and second openings overlying the first and second FET regions;
    forming a high-k layer at the bottom of both the first and second openings;
    forming a doping layer over the high-k layer in both the first and second openings;
    forming a multi-layer mask layer on the doping layer in both the first and second openings;
    in the second opening, removing the multi-layer mask layer and the doping layer to expose the high-k layer in the second opening;
    in the first opening, thinning the multi-layered mask over the high-k in the first opening to formed a thinned mask layer in the first opening;
    annealing the substrate to form a doped high-k in the first opening while the high-k of the second opening remains undoped;
    removing the thinned mask layer to expose the doped high-k in the first opening;
    after removing the thinned mask layer, forming a first work function metal stack in the first opening of the first FET region;
    forming a second work function metal stack in the second opening of the second FET region; and
    filling the first and second openings with a fill material.

2. The method of claim 1 wherein the multi-layered hardmask is from about 25 angstroms to about 70 angstroms thick.

3. The method of claim 1 wherein the multi-layered mask includes a bottom layer, a middle layer, and a top layer.

4. The method of claim 3 wherein the bottom layer and the top layer are the same type of material.

5. The method of claim 4 wherein the bottom layer and the third top layer comprise a metal and a non-metal.

6. The method of claim 5 wherein the bottom layer and third top layer comprise titanium nitride.

7. The method of claim 6 wherein the middle layer contains lanthanum.

8. The method of claim 1 wherein in the first opening, thinning the multi-layered mask over the high-k in the first opening to formed a thinned mask layer in the first opening further comprises:
    removing the top layer selectively to the middle layer.

9. The method of claim 8 wherein removing the top layer selectively to the middle layer comprises etching in a solution comprising peroxide.

10. The method of claim 1, after forming the multi-layer hardmask and before removing the multi-layer mask layer and the doping layer, the method further comprising:
    forming a soft mask lithography stack including an optical planarization layer on the multi-layer hardmask layer;
    exposing and developing the soft mask lithography stack; and
    patterning the optical planarization layer with a reactive ion etch to remove the optical planarization over the second FET region while the multi-layered mask protects the high-k layer in the second opening.

* * * * *